(12) United States Patent
Toda et al.

(10) Patent No.: US 11,417,554 B2
(45) Date of Patent: Aug. 16, 2022

(54) SUBSTRATE STORAGE CONTAINER AND METHOD OF MANUFACTURING THE SAME

(71) Applicant: Shin-Etsu Polymer Co., Ltd., Tokyo (JP)

(72) Inventors: Junya Toda, Saitama (JP); Hiroshi Mimura, Saitama (JP); Naoto Watanabe, Itoigawa (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 290 days.

(21) Appl. No.: 16/635,278

(22) PCT Filed: Jul. 10, 2018

(86) PCT No.: PCT/JP2018/026060
§ 371 (c)(1),
(2) Date: Jan. 30, 2020

(87) PCT Pub. No.: WO2019/031142
PCT Pub. Date: Feb. 14, 2019

(65) Prior Publication Data
US 2020/0373180 A1 Nov. 26, 2020

(30) Foreign Application Priority Data
Aug. 10, 2017 (JP) ............................. JP2017-154847

(51) Int. Cl.
*H01L 21/673* (2006.01)
(52) U.S. Cl.
CPC .... *H01L 21/67379* (2013.01); *H01L 21/6734* (2013.01)

(58) Field of Classification Search
CPC .......... H01L 21/67359; H01L 21/6735; H01L 21/673; H01L 21/67379
(Continued)

(56) References Cited

U.S. PATENT DOCUMENTS

| 6,267,245 B1 * | 7/2001 | Bores ................ H01L 21/67383 206/711 |
| 2004/0011960 A1 | 1/2004 | Morooka et al. |
| 2012/0037522 A1 * | 2/2012 | Chiu ................ H01L 21/67359 206/316.1 |

FOREIGN PATENT DOCUMENTS

| JP | 8273999 A | 10/1996 |
| JP | 2002299428 A | 10/2002 |

(Continued)

OTHER PUBLICATIONS

Office Action issued in JP2019535041 dated Dec. 14, 2021.

*Primary Examiner* — King M Chu
(74) *Attorney, Agent, or Firm* — The Webb Law Firm (57) ABSTRACT

There is provided a substrate storage container 1 capable of suppressing deformation of a functional member insert-molded and a method of manufacturing the container 1, and an device positioning member 4 as the functional member including: an attachment part 41 having a thick section 413 formed in thickness equal to a wall member of a container body 10 or a lid 20 and a thin section 410 decreasing in thickness as it approaches toward an outer edge from the thick section 413; and a body part 42 coupled to the attachment part 41, the device positioning member 4 being disposed on the container body 10 or the lid 20 so that a first surface 420 of the thick section 413 is flush with an inner surface of the wall member.

19 Claims, 9 Drawing Sheets

(58) Field of Classification Search
USPC .......................................................... 206/710
See application file for complete search history.

(56) References Cited

FOREIGN PATENT DOCUMENTS

| | | |
|---|---|---|
| JP | 4184701 B2 | 11/2008 |
| JP | 201750494 A | 3/2017 |
| WO | 2006120866 A1 | 11/2006 |

\* cited by examiner

PRIOR ART

FIG. 10B

PRIOR ART

SUBSTRATE STORAGE CONTAINER AND METHOD OF MANUFACTURING THE SAME

CROSS-REFERENCE TO RELATED APPLICATIONS

This application is the United States national phase of International Application No. PCT/JP2018/026060 filed Jul. 10, 2018, and claims priority to Japanese Patent Application No. 2017-154847 filed Aug. 10, 2017, the disclosures of which are hereby incorporated by reference in their entirety.

BACKGROUND OF THE INVENTION

Field of the Invention

The present invention relates to a substrate storage container with a functional member insert-molded and a method of manufacturing the same.

Description of Related Art

In a substrate storage container including a container body storing a substrate and a lid closing an opening of the container body, there has been sometimes provided with a functional member which is improved in functions of slidability and wear resistance, etc. by using a material different from the container body, etc. Example of the functional member includes a device positioning member getting in contact with a positioning means of a transporting device to transport the substrate storage container or a positioning means of a processing device to process the substrate. The functional member is integrally formed in the container body, etc. by insert-molding (see International Publication No. 2006/120866 and Japanese Patent Application Laid-Open Publication No. 2002-299428).

Figure 10A:
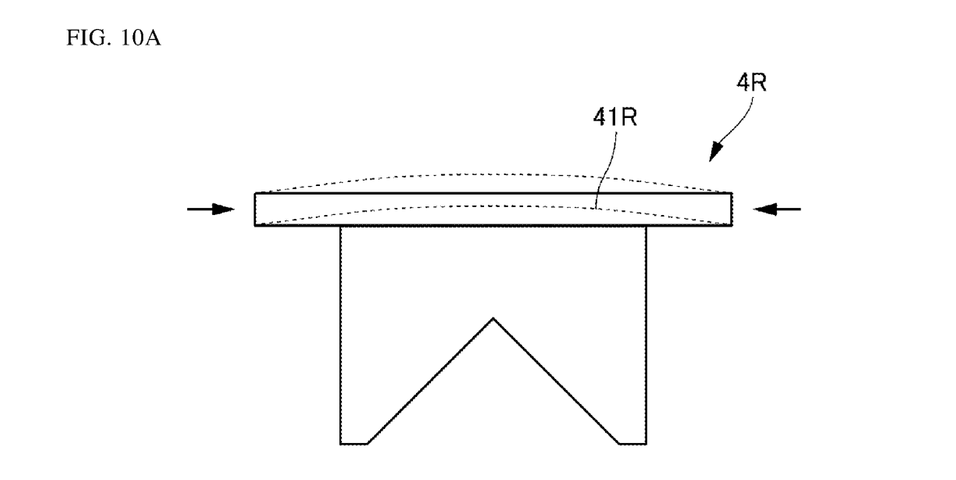
FIG. 10A is a schematic view showing a first case in which stress is applied by insert-molding in a conventional device positioning member.
Figure 10B:
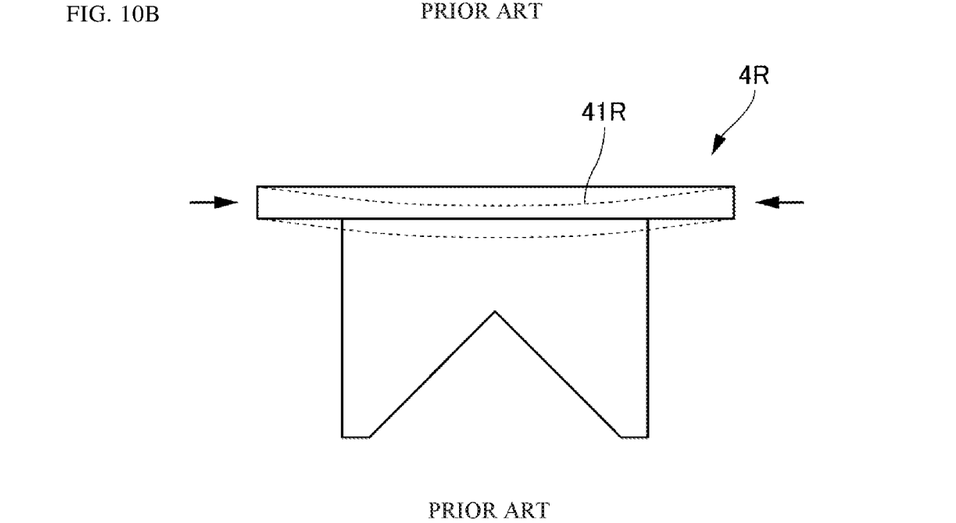
FIG. 10B are a schematic view showing a second case in which stress is applied by insert-molding in a conventional device positioning member.

In insert-molding, due to heating during molding or heat removal after molding, shrinkage has sometimes occurred in an attachment part 41R of a device positioning member 4R to cause sink mark or unevenness, resulting in deterioration in accuracy of dimensions and position or in deformation of the functional member insert-molded (see FIGS. 10A-10B).

So, International Publication No. 2006/120866 discloses that a groove portion into which a molding resin flows is formed on a functional member to relax stress in shrinking. Japanese Patent Application Laid-Open Publication No. 2002-299428 discloses that a vertical or horizontal adhesion reinforcing rib is formed on a functional member to increase a degree of adhesion with a container body.

[Patent Literature 1] International Publication No. 2006/120866

[Patent Literature 2] Japanese Patent Application Laid-Open Publication No. 2002-299428

However, Japanese Patent Application Laid-Open Publication No. 2002-299428 does not disclose a specific shape or dimensions of an adhesion reinforcing rib, and then it is needed to actually prototype and design an adhesion reinforcing rib according to a variation of types (shape and/or dimensions) of a functional member.

SUMMARY OF THE INVENTION

Therefore, the present invention has been made in view of the above problems, and the present invention is to provide a substrate storage container capable of suppressing deformation of a functional member insert-molded and to provide a method of manufacturing the same.

(1) A first aspect in accordance with the present invention provides a substrate storage container including: a container body storing a substrate; a lid closing an opening of the container body; and a functional member formed integrally with the container body or the lid by insert-molding, wherein the functional member includes: an attachment part having a thick section formed in thickness equal to a wall member of the container body or the lid and a thin section decreasing in thickness as it approaches toward an outer edge from the thick section; and a body part coupled to the attachment part, the functional member being disposed in the container body or the lid so that a first surface of the thick section is flush with an inner surface of the wall member;

(2) In the first aspect according to the above (1), the thin section may be formed, so as to decrease in thickness as it approaches toward the outer edge, in an acute shape having an inclined surface;

(3) In the first aspect according to the above (1), the thin section may be formed, so as to decrease in thickness as it approaches toward the outer edge, in a thin-walled shape having: an inclined surface inclined by 20° or more with respect to a direction orthogonal to a thickness direction; and a top surface along the thickness direction;

(4) In the first aspect according to the above (1), the thin section may be formed, so as to decrease in thickness as it approaches toward the outer edge, as a convex part protruding in a direction orthogonal to a thickness direction;

(5) In the first aspect according to any one of the above (1) to (4), the thin section may be provided over a circumference of the thick section via a step surface along a thickness direction at the circumference of the thick section;

(6) In the first aspect according to the above (5), the thin section may have 2.00 mm or less of a protrusion amount from the step surface to a tip in a direction orthogonal to the thickness direction;

(7) In the first aspect according to any one of the above (1) to (6), the functional member may be formed of a material having a friction coefficient different from a material forming the container body or the lid;

(8) In the first aspect according to any one of the above (1) to (7), the functional member may be formed outside of the container body, when the opening faces front, as a device positioning portion to get in contact with a positioning means of a processing device or a transporting device;

(9) In the first aspect according to the above (8), the device positioning portion may be formed in a manner that a first side thereof to be located in the container body or the lid is in a block shape as the attachment part, a second side is provided with a positioning groove to get in contact with the positioning means, and a plurality of ribs are disposed on a peripheral surface between the first side and the second side; and (10) A second aspect in accordance with the present invention provides the substrate storage container comprising: a container body storing a substrate; a lid closing an opening of the container body; and a functional member formed integrally with the container body or the lid by insert-molding, the functional member comprising: an attachment part having a thick section formed in thickness equal to a wall member of the container body or the lid and a thin section decreasing in thickness as it approaches toward an outer edge from the thick section; and a body part coupled to the attachment part, the method comprising a step of insert-molding the functional member in the container body or the lid, so that a first surface of the attachment part is flush with an inner surface of the container body or the lid.

Advantageous Effects of Invention

According to the present invention, it is possible to provide a substrate storage container capable of suppressing deformation of a functional member insert-molded and to provide a method of manufacturing the same.

DESCRIPTION OF THE INVENTION

Hereinafter, Embodiments according to the present invention are described in detail with reference to the drawings. In Embodiments of the present description, the same members, portions and parts are denoted by the same reference signs throughout.

Figure 1:
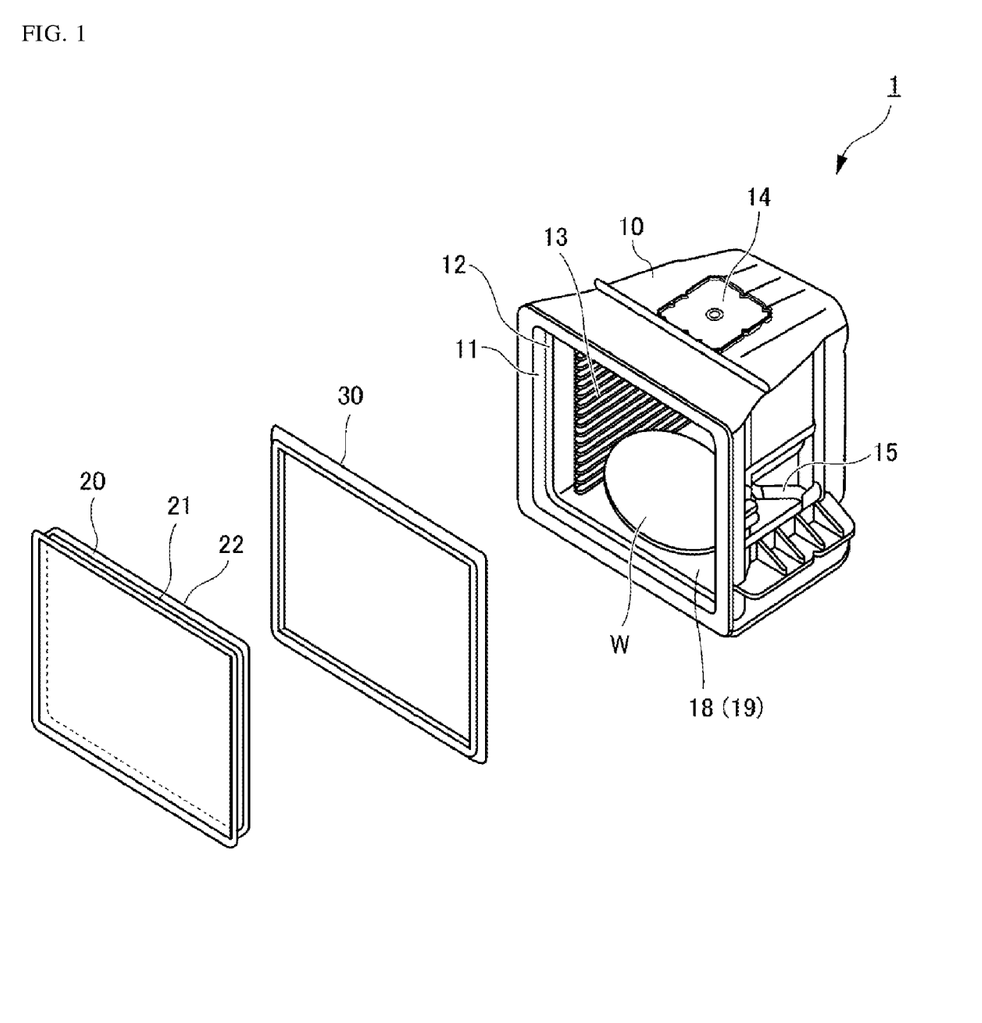
FIG. 1 is an exploded schematic perspective view showing a substrate storage container according to a first Embodiment.
Figure 2:
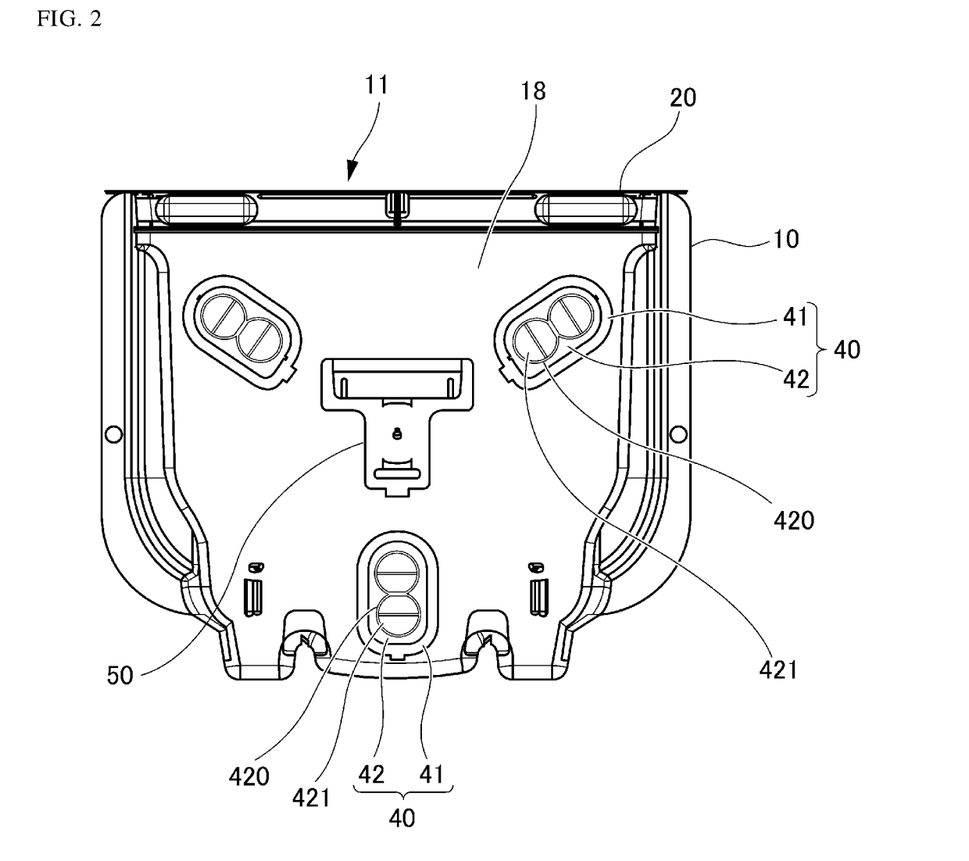
FIG. 2 is a bottom view of the substrate storage container.
Figure 3:
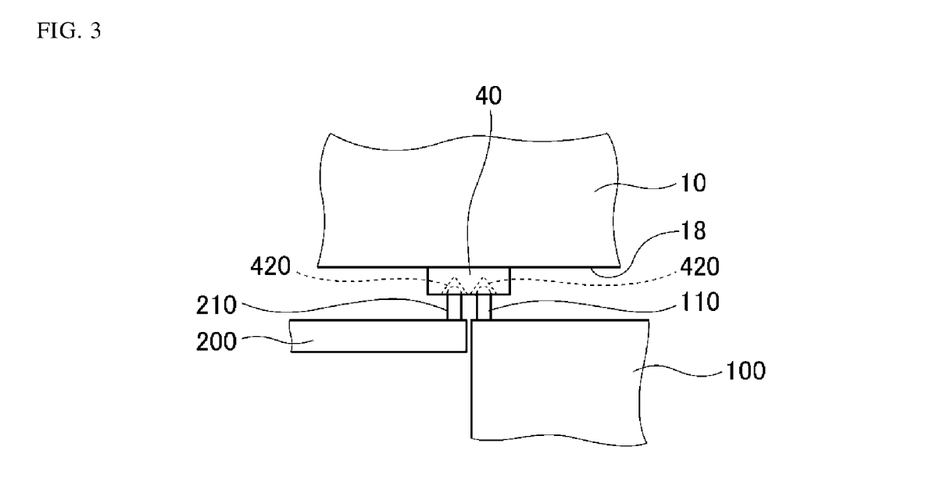
FIG. 3 is a schematic view showing a state that the substrate storage container is positioned.

FIG. 1 is an exploded schematic perspective view showing a substrate storage container 1. FIG. 2 is a bottom view of the substrate storage container 1. FIG. 3 is a schematic view showing a state that the substrate storage container 1 is positioned. As shown in FIG. 1, the substrate storage container 1 is provided with a container body 10 storing a substrate W, a lid 20 closing an opening 11 of the container body 10, and an annular packing 30 to be disposed between the container body 10 and the lid 20.

The container body 10 is formed in a box shape and of a front open type where the opening 11 faces front. The opening 11 is formed bent with a step so as to spread outward, and a surface of the step is formed on an inner peripheral edge of the front of the opening 11 as a seal surface 12 with which the packing 30 is in contact. The container body 10 may be a bottom open type where the opening 11 faces upward. However, a front open type is preferable considering easiness in inserting a substrate W having a diameter of 300 mm or 450 mm into the container body 10.

Supports 13 are disposed on right and left sides inside the container body 10, respectively. The supports 13 have functions of placing and positioning the substrate W. The supports 13 are provided with a plurality of grooves in a height direction to constitute a so-called groove teeth. Then, the substrate(s) W is (are) placed on a pair of right and left groove teeth positioned at the same level. A material of the supports 13 may be the same as that of the container body 10, but a different material may be also used in order to improve cleanability and slidability.

Further, a rear retainer is disposed on a rear side (a back wall) inside the container body 10. When the lid 20 is closed, the rear retainer holds the substrate W by forming a pair with a front retainer described later. However, without providing the rear retainer as in the present Embodiment, the supports 13 may have a substrate holding part in a V-shape on a base side of the groove teeth, so that the substrate W may be held between the front retainer and the substrate holding part. The rear retainer is also provided with a plurality of grooves in a height direction to constitute a so-called groove teeth. A material of the rear retainer may be the same as that of the container body 10, but a different material may be used in order to improve cleanability and slidability. The supports 13 and the rear retainer are provided on the container body 10 by insert-molding, etc.

The substrate W is stored in the container body 10 by support of the front retainer and the supports 13, but may be stored in the container body 10 by support of the front retainer and the rear retainer. Example of the substrate W includes a silicon wafer, but it is not particularly limited thereto, and example of the substrate W may include a quartz wafer, a gallium arsenide wafer, etc.

A robotic flange 14 is detachably provided in a middle part of a top plate of the container body 10. The substrate storage container 1 in which the substrate W is airtightly stored is transported, in a manner that the robotic flange 14 is held by a transporting robot in a factory, to a processing device 100 corresponding to each step to process the substrate W in a clean state.

An engaging hole (not shown) is formed on the inner peripheral edge of the opening 11 of the container body 10. The lid 20 is engaged to the container body 10 in a state that the lid 20 is pressed against the container body 10 via the packing 30. In addition, manual handles 15 to be gripped by an operator are detachably attached to middle parts of both outer surfaces of the container body 10, respectively.

Moreover, a device positioning portion 40 capable of getting in contact with a positioning pin 110 as a positioning means of a processing device 100 and a positioning pin 210 as a positioning means of a transporting device 200 is formed outside a bottom plate 18 of the container body 10 (see FIG. 3). Details of the device positioning portion 40 are described later. In addition, a clamping feature 50 to be used in fixing to the processing device 100 is also formed in a substantially middle part of the bottom plate 18 (see FIG. 2).

On the other hand, the lid 20 is formed in a substantially rectangular shape to be attached to a front surface of the opening 11 of the container body 10. The lid 20 has a locking mechanism (not shown) and is locked in a manner that an engaging claw is fitted in an engaging hole (not shown)

formed in the container body 10. The lid 20 is provided with an elastic front retainer (not shown) as detachably attached or integrally formed in a middle part thereof to hold horizontally a front peripheral edge of the substrate W. The lid 20 is provided with a small ventilation filter (not shown) to allow the inside and the outside of the substrate storage container 1 to communicate with each other.

Since the front retainer is a part in direct contact with the substrate W as well as the groove teeth and the substrate holding part of the support 13, a material having good cleanability and slidability may be preferably used therefor. The front retainer may be also provided on the lid 20 by insert-molding or fitting.

Then, the lid 20 is provided with an attachment groove 21 to attach the packing 30. More specifically, a protrusion 22 smaller than the step of the opening 11 is formed in an annular shape on a surface of the lid 20 facing the container body 10, so that the attachment groove 21 in a substantially U-shaped cross section is formed in an annular shape. When the lid 20 is attached to the container body 10, the protrusion 22 enters deeper than the step of the opening 11.

Example of a material of the container body 10 and the lid 20 may include thermoplastic resins such as polycarbonate, cycloolefin polymer, polyetherimide, polyethersulfone, polyetheretherketone, and liquid crystal polymer. Conductive agents such as conductive carbon, conductive fiber, metal fiber, conductive polymer, etc. and besides various antistatic agents, ultraviolet absorbers, and the like may be added as appropriate into thermoplastic resins.

Next, the packing 30 is annularly formed corresponding to a front shape of the lid 20 (and a shape of the opening 11 of the container body 10), and has a rectangular frame shape in the present Embodiment. However, the annular packing 30 may have a ring frame shape before being attached to the lid 20.

The packing 30 is disposed between the seal surface 12 of the container body 10 and the lid 20 to ensure airtightness of the substrate storage container 1 by getting in close contact with the seal surface 12 and the lid 20 when the lid 20 is attached to the container body 10. Thereby, it results in reducing entry of dust and moisture from the outside into the substrate storage container 1, and in reducing leakage of gas from the inside to the outside.

Example of a material of the packing 30 may include thermoplastic elastomers such as a polyester elastomer, a polyolefin elastomer, a fluorine elastomer, a urethane elastomer, etc. and besides rubbers such as a fluorine rubber, an ethylene propylene rubber, a silicone rubber, etc. Carbon fiber, metal fiber, metal oxide, various antistatic agents, etc. may be added as appropriate to this material from the viewpoint of imparting conductivity and antistatic properties. In addition, from the viewpoint of improving adhesion of the surface, fillers such as carbon, glass fiber, mica, talc, silica, calcium carbonate, etc. and besides resins such as polyethylene, polyamide, polyacetal, fluorine resin, silicone resin, etc. may be added selectively in a predetermined amount.

Figure 4A:
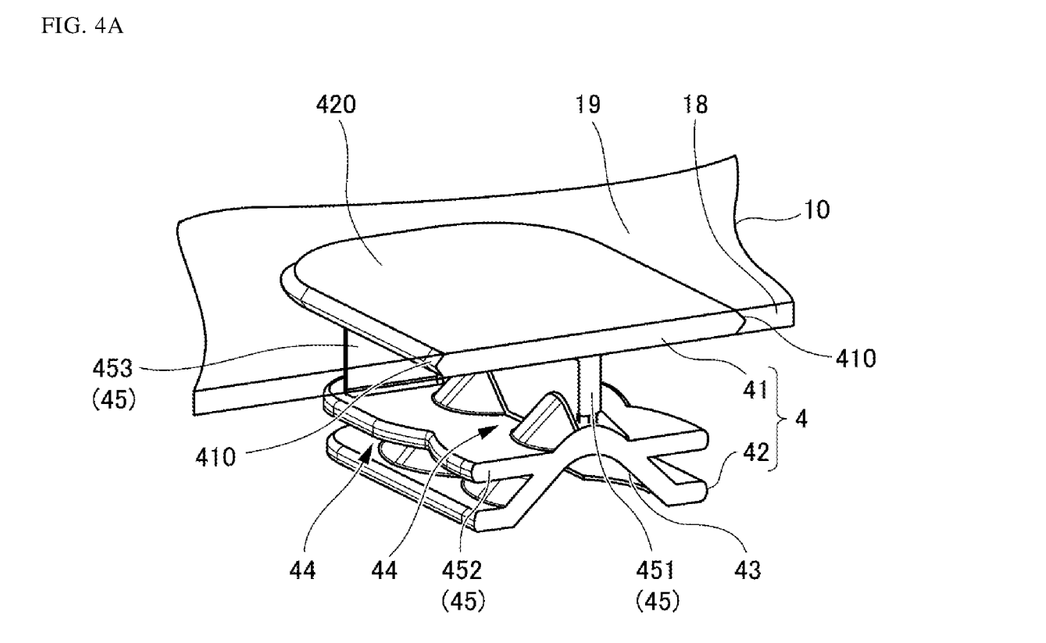
FIG. 4A is a cross-sectional perspective view showing a vicinity of a device positioning portion.
Figure 4B:
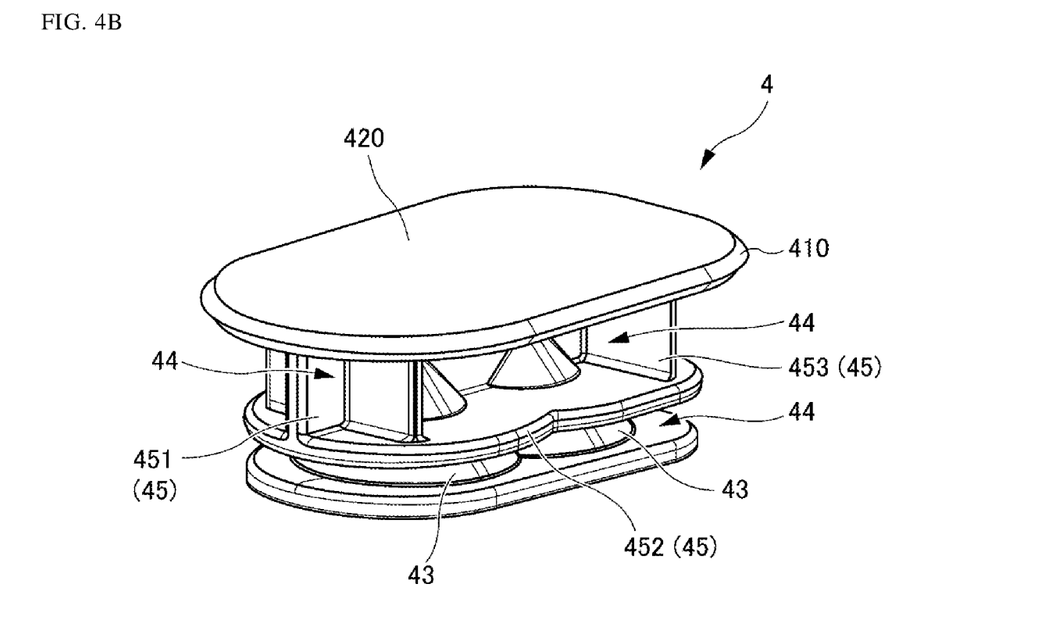
FIG. 4B is a perspective view showing a device positioning member.
Figure 5A:
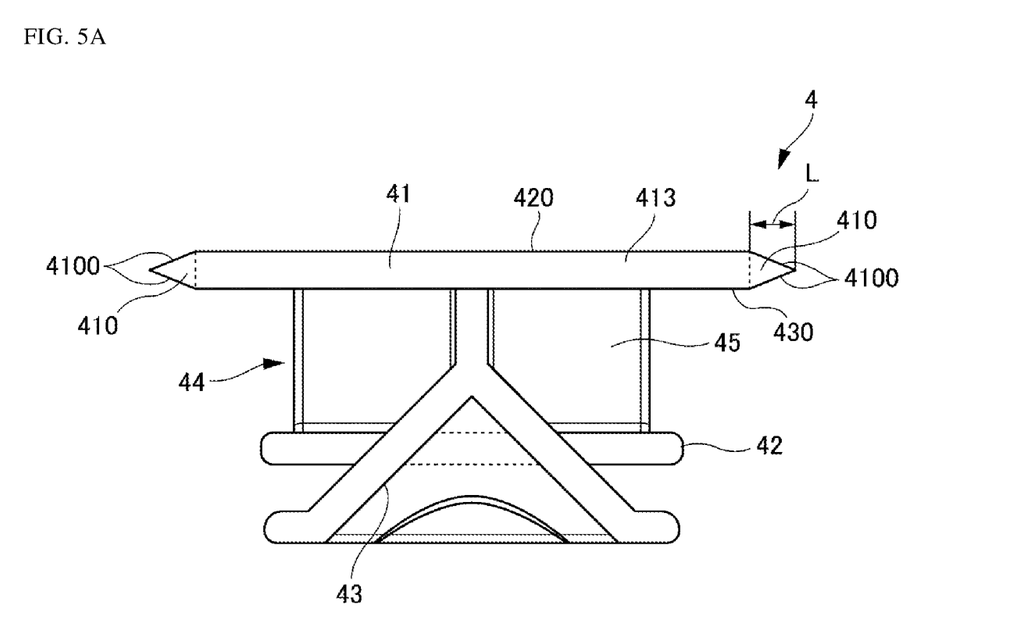
FIG. 5A is a cross-sectional view showing the device positioning member.
Figure 5B:
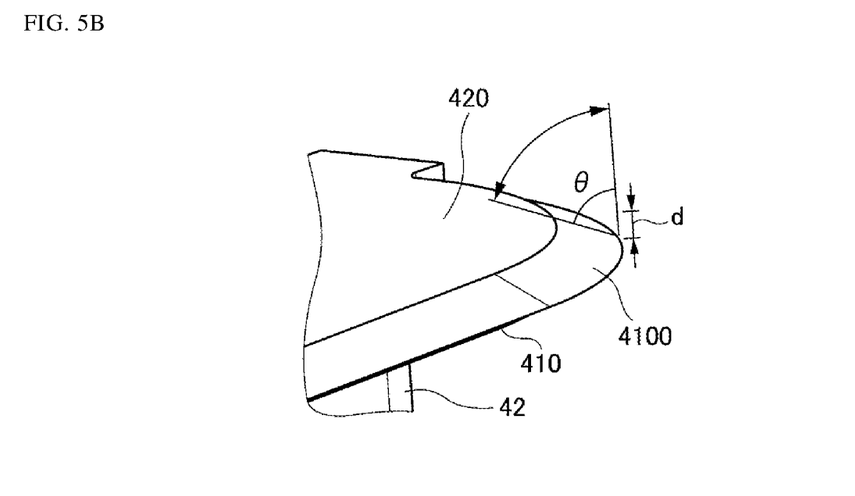
FIG. 5B is a perspective view showing a thin section of the device positioning member.
Figure 6:
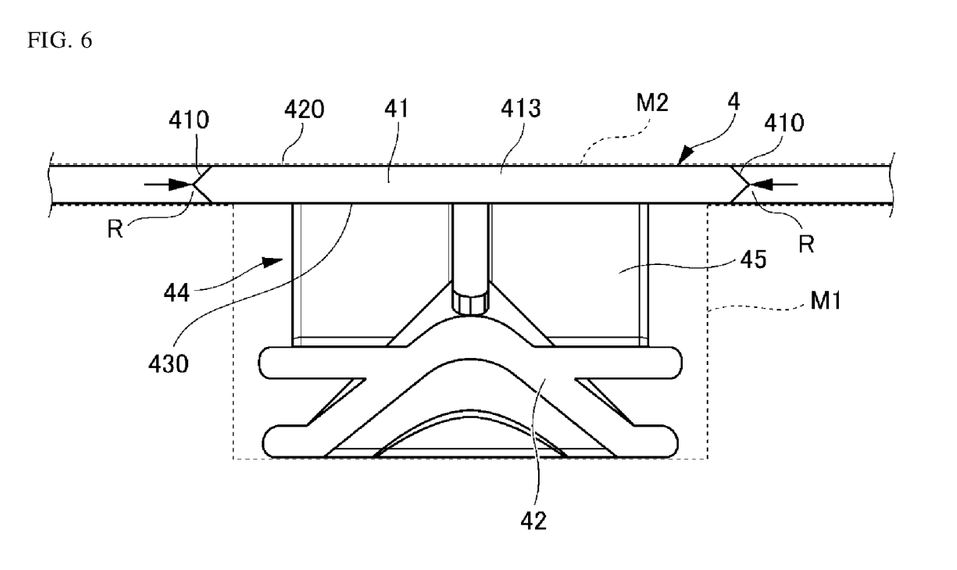
FIG. 6 is a schematic view showing a state that insert-molding is performed.

Hereinafter, the device positioning portion 40 is described in detail. FIG. 4A is a cross-sectional perspective view showing a vicinity of the device positioning portion 40, and FIG. 4B is a perspective view showing a device positioning member 4. FIG. 5A is a cross-sectional view showing the device positioning member 4, and FIG. 5B is a perspective view showing a thin section 410 of the device positioning member 4. FIG. 6 is a schematic view showing a state that insert-molding is performed.

The device positioning portion 40 has a substantially track shape in a bottom view, and is arranged on three locations of the bottom plate 18 at substantially equal intervals on the same circumference so that a longitudinal direction thereof directs to the clamping feature 50 of the bottom plate 18 (see FIG. 2).

The device positioning portion 40 is formed by integrating the device positioning member 4 as a functional member with the container body 10 by insert-molding. The device positioning portion 40 is capable to getting in contact with the positioning pin 110 of the processing device 100 and the positioning pin 210 of the transporting device 200.

The device positioning member 4 includes an attachment part 41 having a thick section 413 formed in thickness equal to the bottom plate 18 (a wall member) of the container body 10, and a body part 42 coupled to the attachment part 41. The device positioning member 4 is disposed at an insert position of the container body 10 so that a first surface 420 of the attachment part 41 is flush with an inner surface 19 of the bottom plate 18 of the container body 10 (see FIGS. 4A and 4B). The details of the attachment part 41 are described later.

The attachment part 41 and the body part 42 constituting the device positioning member 4 are integrally formed in the present Embodiment, but may be separately formed.

The body part 42 includes a positioning groove 43 to get in contact with the positioning pin 110 of the processing device 100 or the positioning pin 210 of the transporting device 200, a plurality of ribs 45, and a plurality of recesses 44 partitioned by the plurality of ribs 45.

The positioning groove 43 is formed in two side by side along the longitudinal direction of the device positioning portion 40 so as to be connected to the attachment part 41 via a vertical main rib 451 as described later. For example, when the substrate storage container 1 is delivered from the transporting device 200 to the processing device 100, in order to perform positioning, the positioning pin 110 of the processing device 100 gets in contact with one of the positioning grooves 43 and the positioning pin 210 of the transporting device 200 gets in contact with the other of the positioning grooves 43.

The plurality of ribs 45 include one vertical main rib 451 to connect the attachment part 41 and the positioning groove 43, one lateral rib 452 to be connected to the positioning groove 43 orthogonally to the vertical main rib 451, and two vertical sub ribs 453 to connect the attachment part 41 and the lateral ribs 452. The two vertical sub ribs 453 are connected to the vertical main rib 451 orthogonally to the vertical main rib 451 and the lateral rib 452.

In this way, the device positioning member 4 is formed in a manner that a first side thereof to be located on a side of the container body 10 is in a block shape as the attachment part 41, and a second side is provided with the positioning grooves 43 to get in contact with the positioning pins 110, 210. Then, a plurality of recesses 44 are formed on a peripheral surface between the first side and the second side of the device positioning member 4, and a plurality of ribs 45 are formed between the recesses 44.

It returns to the attachment part 41. As shown in FIGS. 4A, 4B, 5A, and 5B the attachment part 41 further includes a thin section 410 provided integrally with the thick section 413 over a circumference of the thick section 413 so as to decrease in thickness as it approaches toward an outer edge.

In the present Embodiment, the thin section 410 is formed, so as to decrease in thickness as it approaches toward the outer edge, in an acute shape having inclined surfaces 4100. Specifically, the thin section 410 is formed in an acute shape having the inclined surfaces 4100 that are inclined from the first surface 420 of both surfaces of the thick section 413 and from a second surface 430 facing the first surface 420, respectively, so as to decrease continuously in thickness toward the outer edge. Note that the inclined surfaces 4100 are preferably inclined by 20° or more with respect to a direction orthogonal to a thickness direction.

As an example of an acute shape, the thick section 413 has 3.65 mm in thickness, a distance d from the first surface 420 of the attachment part 41 to a tip of the thin section 410 in a thickness direction is 1.73 mm, and the inclined surfaces 4100 have 67.5° in inclination angle θ. In this case, a protrusion amount L from the circumference of the thick section 413 to the tip of the thin section 410 in a direction orthogonal to a thickness direction is 4.18 mm.

The device positioning portion 40 may be formed of a material different from a material forming the container body 10. It is preferable that a material of the device positioning member 4 constituting the device positioning portion 40 may be formed of a material having a friction coefficient lower than a material of the container body 10 against the positioning pins 110, 210 and of a hard material, since the positioning pins 110, 210 provided on the processing device 100 or the transporting device 200 slide on the device positioning member 4 while getting in touch therewith. For example, non-crystalline resins such as polytetrafluoroethylene, polycarbonate containing carbon fiber material or other sliding material, polycarbonate, cyclic olefin polymer (cycloolefin polymer) may be used therefor.

Here, the attachment part 41 of the device positioning member 4 is preferably formed of the same material as that of the container body 10 or a material capable of being welded to the container body 10. For example, two-color molding may be performed in a manner that the attachment part 41 may be formed of a non-crystalline resin such as polycarbonate, a cyclic olefin polymer, etc. and the body part 42 may be formed of a crystalline resin such as polyether ether ketone or polybutylene terephthalate, etc.

A material of the positioning pins 110, 210 is not particularly limited, but SUS (Steel Use Stainless) is preferably used in order to suppress friction powder to be possibly generated due to friction.

Referring to FIG. 4A, FIG. 4B and FIG. 6, a method of manufacturing the substrate storage container 1 is described. The method includes the following steps. In a first step, the device positioning member 4 is formed in plural to include the attachment part 41 having the thick section 413 formed in thickness equal to the bottom plate 18 of the container body 10 and the thin section 410 decreasing in thickness as it approaches toward the outer edge from the thick section 413, and the body part 42 coupled to the attachment part 41. In a second step, the device positioning member 4 is disposed at an insert position of the container body 10 in a manner that the first surface 420 of the attachment part 41 is flush with the inner surface 19 of the container body 10 and further the second surface 430 of the attachment part 41 gets in touch (overlaps) with an upper surface of a cavity block M1 as one mold in use for insert-molding of the device positioning member 4. In a third step, the container body 10 is formed by insert-molding in a manner that the first surface 420 of the attachment part 41 gets in touch (overlaps) with a lower surface of a core block M2 as the other mold corresponding to the cavity block M1 and further, after aligning the cavity block M1 and the core block M2, a secondary resin R is injected to perform insert-molding so that the device positioning member 4 and the secondary resin R are fixed. Arrows shown in FIG. 6 indicate a direction in which the secondary resin R is injected.

In FIG. 6, according to the present Embodiment, when the device positioning member 4 is insert-molded, stress applied to the attachment portion 41 as indicated by the arrows in the figure is relaxed during shrinkage of the secondary resin R, since the thin section 410 of the attachment part 41 has a shape that is easy to melt by decreasing in thickness as it approaches to the outer edge. Therefore, there is provided the substrate storage container 1 capable of suppressing deformation of the device positioning member 4 insert-molded.

Further, since the device positioning member 4 is formed of a material having a low friction coefficient and good slidability, the positioning pins 110, 210 are easily slidable so that it becomes easy to guide the positioning pins 110, 210 to a predetermined position of the device positioning portion 40. Therefore, there is provided the substrate storage container 1 capable of being positioned with high accuracy against the processing device 100 or the transporting device 200 in use for the substrate storage container 1.

Furthermore, since a plurality of recesses 44 are formed on the peripheral surface between the first side and the second side of the device positioning member 4 and the ribs 45 are formed between the recesses 44, an amount of resin is reduced resulting in that sinking hardly occurs when molding the device positioning member 4. Also, it is possible to secure mechanical strength by the ribs 45.

The Embodiment of the present invention has been described in detail above, but the present invention is not limited to the above-described Embodiment, and various modifications and changes can be made within the scope the gist of the present invention described in the claims.

Modification 1

Figure 7A:
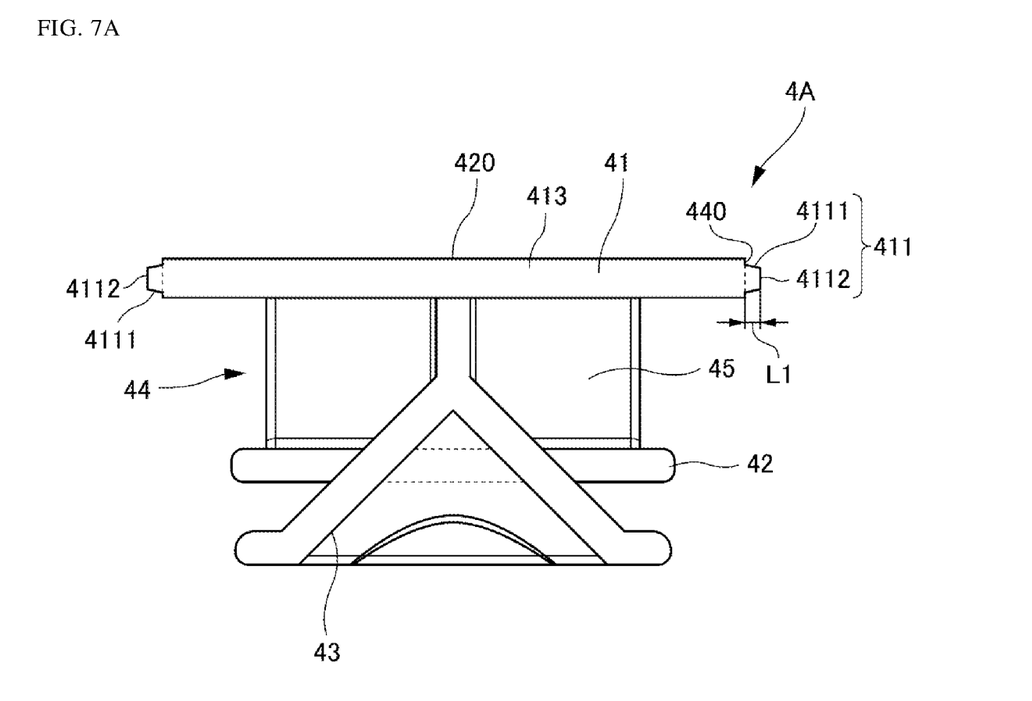
FIG. 7A is a cross-sectional view showing a device positioning member according to Modification 1.

Here, the device positioning member 4A according to Modification 1 is described. FIG. 7A is a cross-sectional view showing the device positioning member 4A according to Modification 1, and FIG. 7B is a cross-sectional perspective view showing a thin section 411 of the device positioning member 4A.

Figure 7B:
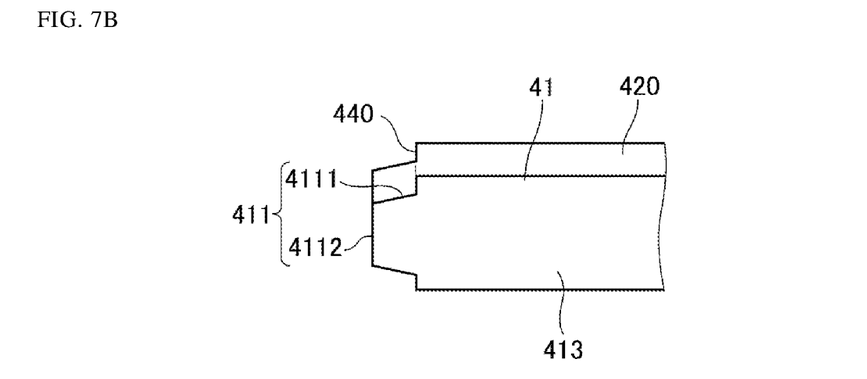
FIG. 7B is a cross-sectional perspective view showing a thin section of the device positioning member according to Modification 1.

In Modification 1, as shown in FIG. 7A and FIG. 7B, the thin section 411 of the device positioning member 4A is formed, so as to decrease continuously in thickness toward the outer edge, in a thin-walled shape having an inclined surface inclined by 20° or more with respect to a direction orthogonal to a thickness direction and a top surface 4112 along a thickness direction. Further, the thin section 411 is provided over a circumference of the thick section 413 via a step surface 440 along a thickness direction at the circumference of the thick section 413.

In addition, a protrusion amount L1 of the thin section 411 from the step surface 440 to the top surface 4112 in a direction orthogonal to a thickness direction is preferably 2.00 mm or less. Furthermore, the protrusion amount L1 of the thin section 411 from the step surface 440 to the top surface 4112 in a direction orthogonal to a thickness direction is more preferably 1.70 mm or less.

According to Modification 1, in addition to the effect of the above Embodiment, since the protrusion amount L1 of the thin portion 411 in a direction orthogonal to a thickness direction is smaller compared to the above Embodiment, an amount of resin to be melted is reduced more resulting in that a spread of molten resin on an end surface can be suppressed and a defect of appearance can be reduced. Moreover, since the thin section 411 is provided over the circumference of the thick section 413 via the step surface 440, a spread of the molten resin of the end surface can be suppressed more, and a defect of appearance can be reduced more.

Modification 2

Figure 8A:
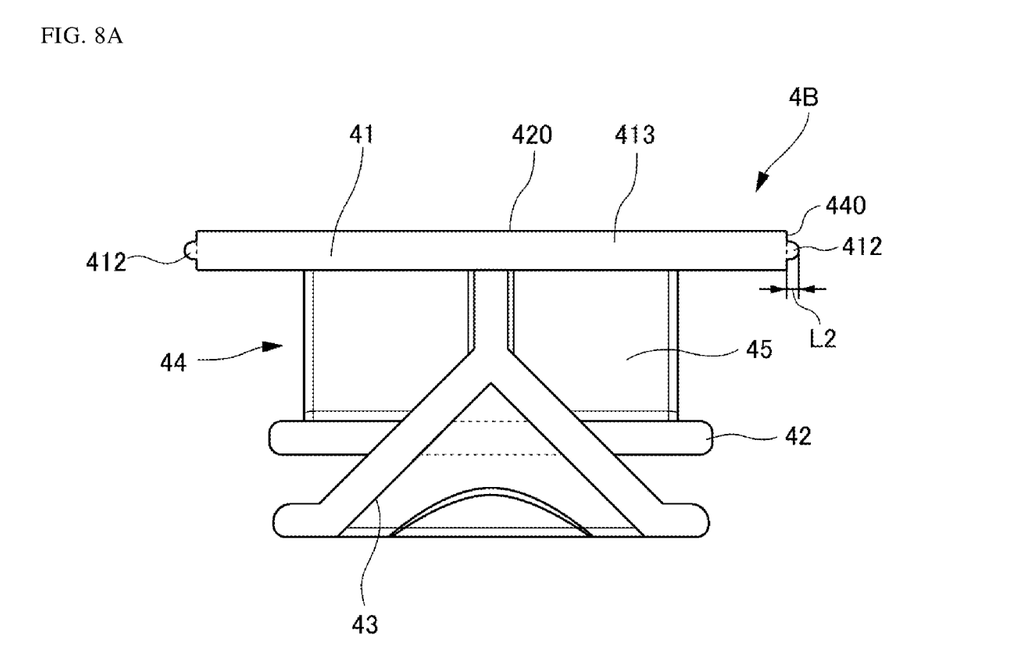
FIG. 8A is a cross-sectional view showing a device positioning member according to Modification 2.

Here, a device positioning member 4B according to Modification 2 is described. FIG. 8A is a cross-sectional view showing the device positioning member 4B according to Modification 2, and FIG. 8B is a cross-sectional perspective view showing a thin section 412 of the device positioning member 4B.

Figure 8B:
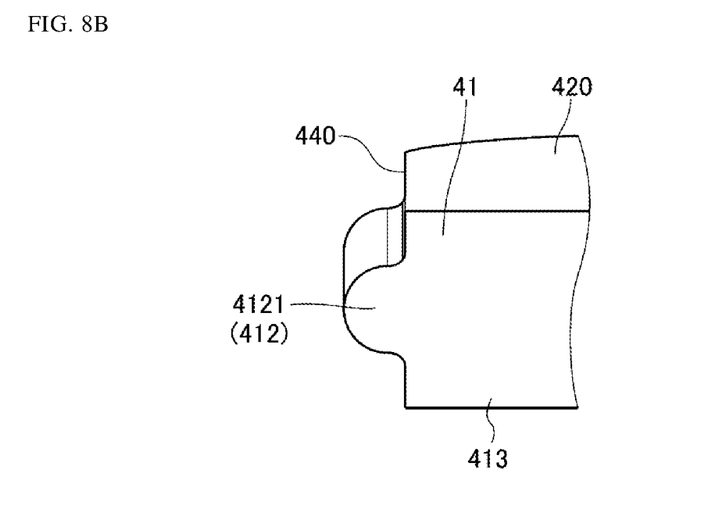
FIG. 8B is a cross-sectional perspective view showing a thin section of the device positioning member according to Modification 2.

In Modification 2, as shown in FIG. 8A and FIG. 8B, the thin section 412 of the device positioning member 4B is formed, so as to decrease continuously in thickness as it approaches toward the outer edge, as a semicircular convex part 4121 protruding in a direction orthogonal to a thickness direction. Similar to the Modification 1, the thin section 412 is provided over a circumference of the thick section 413 via the step surface 440 along a thickness direction at the circumference of the thick section 413. The convex part 4121 is not limited to a semicircular shape, but may be an acute shape, for example.

A protrusion amount L2 of the thin portion 412 from the step surface 440 to a tip of the convex part 4121 in a direction orthogonal to a thickness direction is preferably 2.00 mm or less. Furthermore, the protrusion amount L2 of the thin section 412 from the step surface 440 to the tip of the convex part 4121 in a direction orthogonal to a thickness direction is more preferably 1.70 mm or less.

According to Modification 2, the same effect as Modification 1 can be obtained.

In the above Embodiment and Modifications, the device positioning member 4 as a functional member is insert-molded on the bottom plate 18 of the container body 10, but may be insert-molded on other wall members constituting the container body 10, for example, left and right side walls, a back wall, a top plate, etc., or may be insert-molded on the lid 20.

Figure 9A:
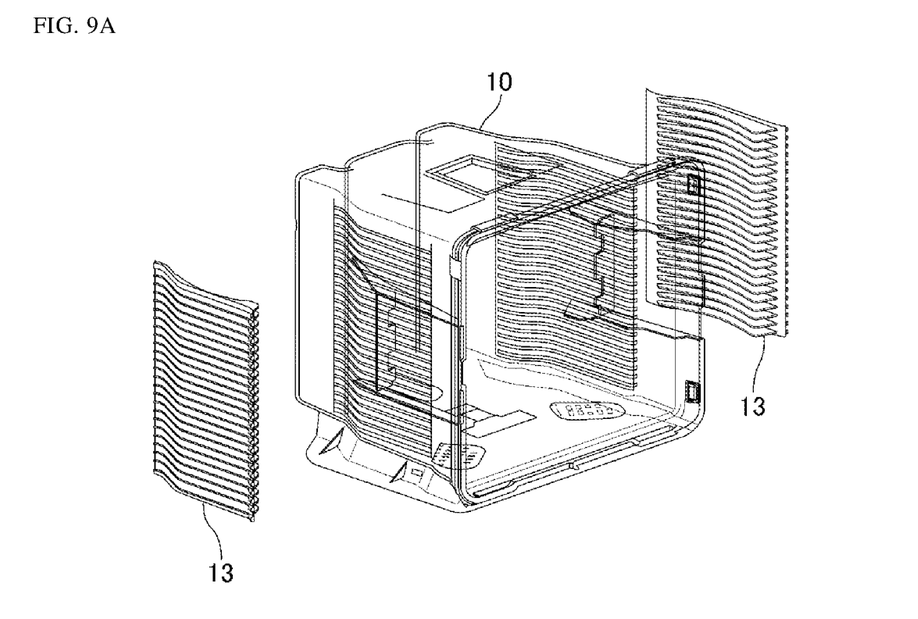
FIGS. 9A and 9B are schematic views showing other functional members.
Figure 9B:
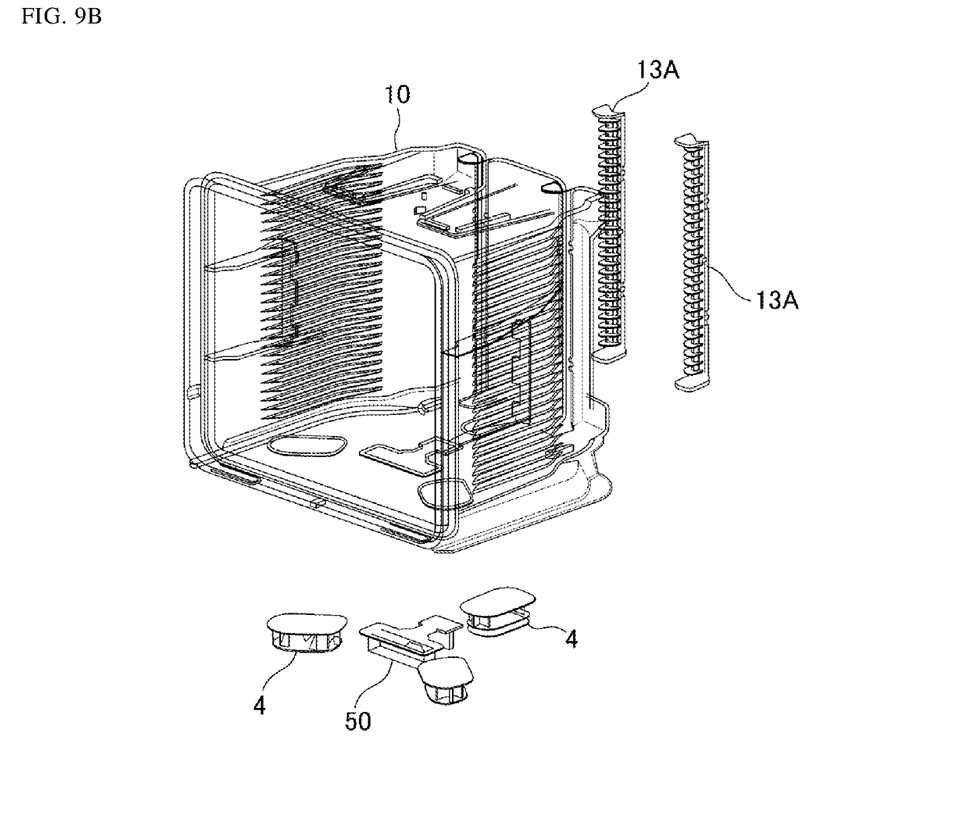

Further, as shown in FIGS. 9A and 9B, examples of the functional member may include the support 13, the rear retainer 13A, and the clamping feature 50. In a case of the rear retainer 13A, the thin section 412 shown in Modification 2 is preferable in shape.

Further, when the functional member is the support 13 or the rear retainer 13A, it is preferable that a friction coefficient thereof is higher than a friction coefficient of a material forming the container body 10 or the lid 20 with respect to the substrate W.

Further, in the above Embodiment and Modifications 1 and 2, the thin sections 410, 411, and 412 are not particularly limited to the shapes shown in the Embodiment and Modifications, as long as any shape decreasing in thickness as it approaches toward the outer edge.

The invention claimed is:

1. A substrate storage container comprising:
a container body storing a substrate;
a lid closing an opening of the container body; and
a functional member formed integrally with the container body or the lid by insert-molding,
wherein the functional member comprises:
an attachment part having a thick section formed in thickness equal to a wall member of the container body or the lid and a thin section decreasing in thickness as the thin section approaches toward an outer edge from the thick section; and
a body part coupled to the attachment part,
the functional member being disposed on the container body or the lid so that a first surface of the thick section and an inner surface of the wall member are flush with each other to form a continuous surface.

2. The substrate storage container according to claim 1, wherein the thin section is formed, so as to decrease in thickness as the thin section approaches toward the outer edge, in an acute shape having inclined surfaces.

3. The substrate storage container according to claim 1, wherein the thin section is formed, so as to decrease in thickness as the thin section approaches toward the outer edge, in a thin-walled shape having: an inclined surface inclined by 20° or more with respect to a direction orthogonal to a thickness direction of the attachment part; and a top surface along the thickness direction.

4. The substrate storage container according to claim 1, wherein the thin section is formed, so as to decrease in thickness as the thin section approaches toward the outer edge, as semicircular part protruding in a direction orthogonal to a thickness direction of the attachment part.

5. The substrate storage container according to claim 1, wherein the thin section is provided on a circumference of the thick section via a step surface along a thickness direction of the attachment part at the circumference of the thick section.

6. The substrate storage container according to claim 5, wherein the thin section has 2.00 mm or less of a protrusion amount from the step surface to a tip in a direction orthogonal to the thickness direction.

7. The substrate storage container according to claim 1, wherein the functional member is formed of a material having a friction coefficient different from a material forming the container body or the lid.

8. The substrate storage container according to claim 1, wherein the functional member is formed outside of the container body, when the opening faces front, as a device positioning portion to get in contact with a positioning means of a processing device or a transporting device.

9. The substrate storage container according to claim 8, wherein the device positioning portion is formed in a manner that a first side thereof to be located on the container body or the lid is in a block shape as the attachment part, a second side is provided with a positioning groove to get in contact with the positioning means, and a plurality of ribs are disposed on a peripheral surface between the first side and the second side.

10. The substrate storage container according to claim 2, wherein the thin section is provided on a circumference of the thick section via a step surface along a thickness direction of the attachment part at the circumference of the thick section.

11. The substrate storage container according to claim 3, wherein the thin section is provided on a circumference of the thick section via a step surface along the thickness direction of the attachment part at the circumference of the thick section.

12. The substrate storage container according to claim 4, wherein the thin section is provided on a circumference of the thick section via a step surface along the thickness direction of the attachment part at the circumference of the thick section.

13. The substrate storage container according to claim 2, wherein the functional member is formed outside of the container body, when the opening faces front, as a device positioning portion to get in contact with a positioning means of a processing device or a transporting device.

14. The substrate storage container according to claim 3, wherein the functional member is formed outside of the container body, when the opening faces front, as a device positioning portion to get in contact with a positioning means of a processing device or a transporting device.

15. The substrate storage container according to claim 4, wherein the functional member is formed outside of the container body, when the opening faces front, as a device positioning portion to get in contact with a positioning means of a processing device or a transporting device.

16. The substrate storage container according to claim 5, wherein the functional member is formed outside of the container body, when the opening faces front, as a device positioning portion to get in contact with a positioning means of a processing device or a transporting device.

17. The substrate storage container according to claim 7, wherein the functional member is formed outside of the container body, when the opening faces front, as a device positioning portion to get in contact with a positioning means of a processing device or a transporting device.

18. The substrate storage container according to claim 2, wherein the functional member is formed of a material having a friction coefficient different from a material forming the container body or the lid.

19. The substrate storage container according to claim 3, wherein the functional member is formed of a material having a friction coefficient different from a material forming the container body or the lid.

* * * * *